United States Patent [19]
Maxwell et al.

[11] Patent Number: 6,144,215
[45] Date of Patent: Nov. 7, 2000

[54] SETUP FOR TESTING AN INTEGRATED CIRCUIT IN A SEMICONDUCTOR CHIP WHEREIN THE TEMPERATURE OF THE SEMICONDUCTOR CHIP IS CONTROLLED

[75] Inventors: Martin M. Maxwell; Dan Weinstein, both of Chandler, Ariz.

[73] Assignee: Intel Corporation, Santa Clara, Calif.

[21] Appl. No.: 09/059,530

[22] Filed: Apr. 13, 1998

[51] Int. Cl.[7] ............................. G01R 1/073; G01R 31/26

[52] U.S. Cl. ........................................... 324/765; 324/760

[58] Field of Search .................................... 324/760, 765, 324/754, 73.1, 158.1; 165/80.3, 80.2, 61; 438/14–18; 257/40, 48; 361/688, 696, 697; 219/209

[56] References Cited

U.S. PATENT DOCUMENTS

| | | | |
|---|---|---|---|
| 4,696,578 | 9/1987 | Mansuria et al. | 324/158.1 |
| 5,006,796 | 4/1991 | Burton et al. | 324/760 |
| 5,260,668 | 11/1993 | MAllory et al. | 324/760 |
| 5,325,052 | 6/1994 | Yamashita | 324/760 |
| 5,414,370 | 5/1995 | Hashinaga et al. | 324/760 |
| 5,473,259 | 12/1995 | Takeda | 324/760 |

*Primary Examiner*—Vinh P. Nguyen
*Attorney, Agent, or Firm*—Blakely, Sokoloff, Taylor & Zafman LLP

[57] ABSTRACT

A test setup for testing an integrated circuit. A holder is provided which is capable of releasably receiving and holding the integrated circuit. Apparatus is provided which tests the integrity of the integrated circuit. A controller is provided which controls the temperature of the integrated circuit.

14 Claims, 2 Drawing Sheets

SETUP FOR TESTING AN INTEGRATED CIRCUIT IN A SEMICONDUCTOR CHIP WHEREIN THE TEMPERATURE OF THE SEMICONDUCTOR CHIP IS CONTROLLED

BACKGROUND OF THE INVENTION

1). Field of the Invention

This invention relates generally to a test setup for testing an integrated circuit in a semiconductor chip. More specifically, this invention relates to such a test setup wherein the temperature of the semiconductor chip is controlled.

2). Discussion of Related Art

Integrated circuits are typically assembled into packages that are mounted to a printed circuit board. The integrity of the integrated circuit is typically tested before integration into a system such as a computer.

The integrated circuit is usually tested in a basic speed and integrity test, followed by a burn-in test and then a product platform validation test. In each of these tests the integrated circuit is held in position by means of a holder and connected to a relevant electrical tester.

The basic test for speed and integrity involves launching a basic program through the integrated circuit.

During the burn-in test a short program is repeatedly executed by the integrated circuit. During the execution and re-execution of this short program the demands on the integrated circuit remain substantially constant so that heat generated by the integrated circuit remains at substantially a constant level.

The integrated circuit may, for example, be a microprocessor. During the product platform validation test a number of operating systems may be launched utilizing the microprocessor. These operating systems do not place constant demands on the microprocessor so that heat generated by the microprocessor varies with time. Variations in heat generated by the microprocessor in turn result in fluctuations in temperature of the integrated circuit. These variations in temperature are undesirable since they could lead to inconsistencies in test data of the integrated circuit. Moreover, these variations in temperature may result in temperatures which are not maintained sufficiently high for purposes of testing the integrated circuit at a sufficiently high temperature.

What is therefore required is a test setup and a method wherein the temperature of the integrated circuit is maintained at a more constant level, particularly when carrying out a product platform validation test on the integrated circuit utilizing a computer. Moreover, these variations in temperature result in temperatures which are not maintained sufficiently high for purposes of testing the integrated circuit at a sufficiently high temperature.

SUMMARY OF THE INVENTION

A test setup for testing an integrated circuit. A holder is provided which is capable of releasably receiving and holding the integrated circuit. Apparatus is provided which tests the integrity of the integrated circuit. A controller is provided which controls the temperature of the integrated circuit.

BRIEF DESCRIPTION OF THE DRAWINGS

The invention is further described by way of example with reference to the accompanying drawings wherein.

DETAILED DESCRIPTION

Figure 1:
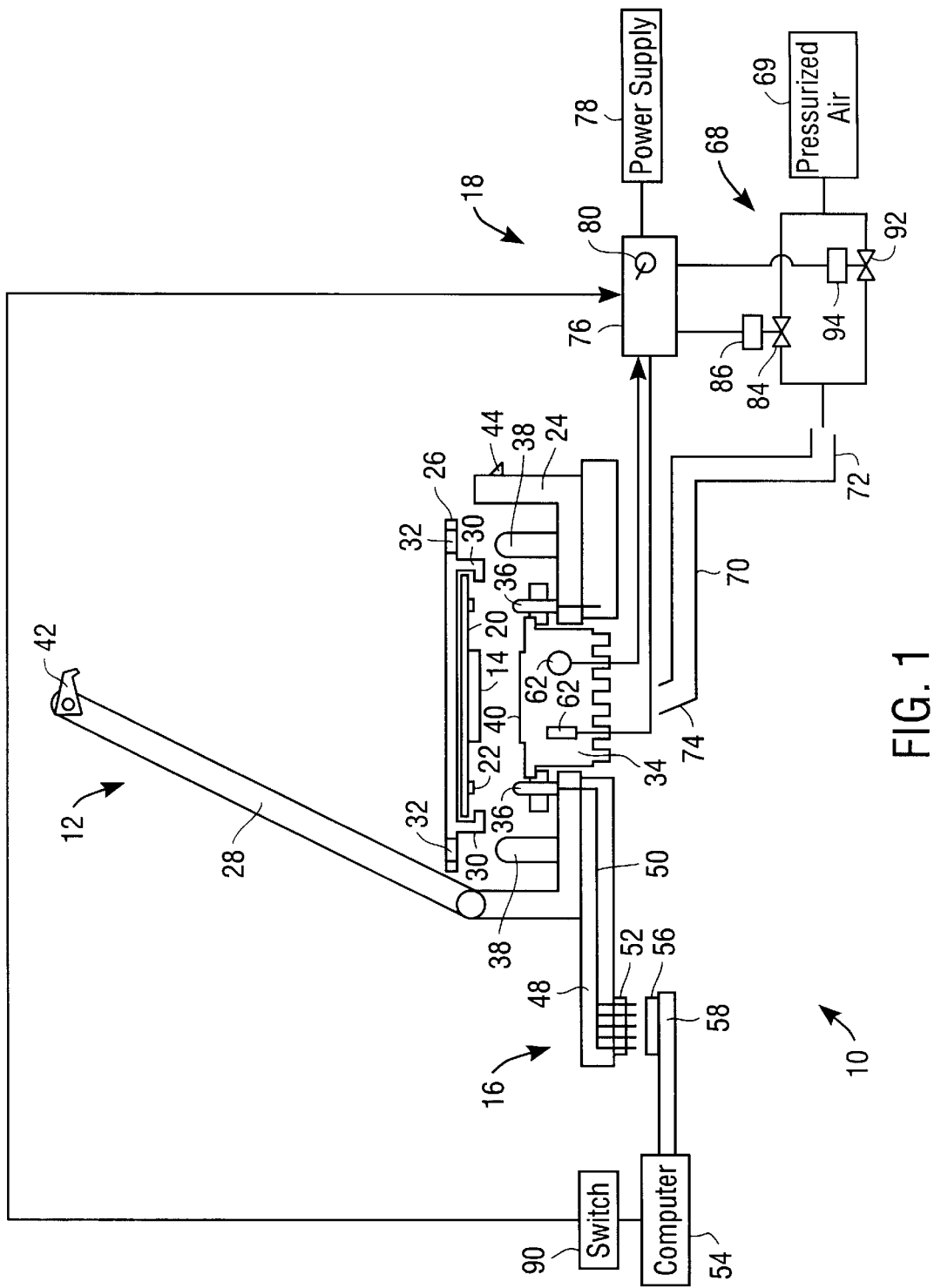
FIG. 1 is a diagram illustrating an embodiment of a test setup according to the invention.

FIG. 1 of the accompanying drawings illustrates a test setup 10 according to the invention which includes a holder 12 capable of releasably receiving and holding an integrated circuit, apparatus 16 for testing the integrity of an integrated circuit 14, and a controller 18 for controlling the temperature of the semiconductor chip 14 during test.

The integrated circuit 14 is located on a substrate 20. The integrated circuit 14 is electrically connected to lands 22 on the substrate 20.

The holder 12 includes a base 24, a cap 26 and a latch 28 which is pivotally mounted to the base 24.

The cap 26 includes clips 30 which hold the substrate 20 in position with the integrated circuit 14 located on a side of the substrate 20 opposing the cap 26. Holes 32 are formed in a periphery of the cap 26.

An opening is formed in the base 24 and a finned heat sink 34 is supported by the base 24 in a position so that the heat sink 34 extends through the opening in the base 24. Electrical contacts 36, such as pogo pins, and alignment pins 38 are also located on the base 24 to align contacts 36 and lands 22.

The cap 26 engages with the base 24 so that the engagement pins 38 mate with the holes 32. The respective lands 22 are then aligned and make contact with the respective electrical contacts 36, and a surface 40 of the heat sink 34 then makes contact with the integrated circuit 14. Heat may so be transferred between the heat sink 34 and the integrated circuit 14. Any change in temperature of the heat sink 34 will therefore also cause a change in temperature of the integrated circuit 14.

The latch 28 may then be flipped onto the base 24 to hold the cap 26 in position on the base 24. Clips 42 and 44, on the latch 28 and the base 24 respectively, interengage to keep the latch 28 in position.

The present invention is described with reference to a integrated circuit 14 which is located on a substrate having lands 22 which surround the integrated circuit 14. Such a structure may, for example, be a integrated circuit 14 which is mounted to a thin film with electrical leads in the form of tape automated bonding (TAB) tape connecting the integrated circuit 14 to the lands 22. It should be understood that a holder 12 may be designed to hold chips which are formed on any other substrate. The lands may be positioned differently on the substrate, and the semiconductor chip may be located on the substrate in any other way.

The apparatus 16 for testing the integrity of the integrated circuit 14 includes a card 48 having electrical traces 50 formed thereon, an electrical socket 52 which is mounted to the card 48 with the electrical traces 50 connected to the socket 52, and a computer 54. The base 24 of the holder 12 is mounted on the card 48 and the electrical contacts 36 are connected to the electrical traces 50.

The electrical socket 52 may be plugged into a complementary socket 56 on a card 58 of the computer 54. The socket 56 on the computer 54 may for example be a zero insertion force (ZIF) socket. The integrity of the integrated circuit 14 may therefore be tested utilizing the computer 54 with an electrical link between the computer 54 and the integrated circuit 14 being established via the card 58 on the computer 54, the socket 56 on the card 58, the electrical socket 52, the card 58, the electrical contacts 36, the lands 22 and the leads (not shown) connecting the lands 22 with the integrated circuit 14.

The integrated circuit 14 may, for example, be a microprocessor. The computer 54 is operated so that the microprocessor becomes a microprocessor of the computer. Testing of the microprocessor would then, for example, involve loading one or more operating systems into memory in the computer 54, and testing the microprocessor's response to the loading and operating of each operating system.

The demands of the operating system or operating systems on the microprocessor varies continuously during the loading and operation of the operating systems. These variable demands on the microprocessor tend to heat the integrated circuit 14 at different rates over time, tending to cause fluctuations in temperature of the integrated circuit 14. These temperature fluctuations are undesirable because they affect the performance of the integrated circuit with time, with resulting inconsistencies in measured characteristics of the integrated circuit.

A thermistor 62 is located within the heat sink 34. The thermistor 62 measures the temperature of the heat sink 34. Since the temperature of the integrated circuit 14 closely follows the temperature of the heat sink 34, the thermistor therefore also measures a variable which is indicative of the temperature of the integrated circuit 14.

The controller 18 is connected to the thermistor 62 and reacts to a temperature measured by the thermistor 62 to alter the temperature of the heat sink 34. An alteration in temperature of the heat sink 34 will, in turn, cause adjustment in the temperature of the integrated circuit 14.

The controller 18 includes a heater 66 located within the heat sink 34, a flow control unit 68 connected to a source of pressurized air 69, a pipe 70 having a first end 72 connected to the flow control unit 68 and a second end 74 positioned to blow fluid, received from the flow control unit, onto fins of the heat sink 34, and a central control unit 76.

The central control unit 76 has an input from the thermistor 62. The central control unit 76 is also connected to both the heater 66 and the flow control unit 68, and to a power supply 78. The central control unit 76 has a dial 80 for selecting a required temperature.

In use, an operator selects a required chip temperature by means of the dial 80. The central control unit 76 compares the temperature measured by the thermistor 62 with the temperature selected by the means of the dial 80. Reacting on the difference in temperatures, the central control unit 76 then operates in one of two modes, the first mode being wherein the temperature selected by means of the dial 80 is more than the temperature measured by the thermistor 62 and the second mode wherein the temperature selected by means of the dial 80 is less than the temperature measured by means of the thermistor 62.

In the first mode the central control unit provides power, supplied by the power supply 78, to the heater 66. The amount of power supplied is typically altered in an on/off manner. It may be possible to vary amount of power supplied as a function of time or temperature. The amount of power supplied to the heater may, for example, be a function of the difference in temperatures selected by the dial 80 and measured by the thermistor 62 so that the power supplied to the heater 66 is progressively variable depending on the difference in temperatures. The amount of power supplied may, alternatively, be controlled by means of a convectional proportional integral derivatative (PID) function. In the first mode the central control unit 76 also shuts down a first valve 84 of the flow control unit 68 by shutting down power supplied to a solenoid 86 which opens and closes the first valve 84. The first valve 84 is located in line between the source of pressurized air 69 and the pipe 70. By shutting down the first valve 84, no flow is supplied to the pipe 70 or to the heat sink 34.

In the second mode, the central control unit 76 shuts down power supplied to the heater 66 and opens the first valve 84 by supplying power to the solenoid 86. When the pipe 70 blows the fluid over the heat sink 34, the temperature of the heat sink 34, and therefore the temperature of the integrated circuit 14, will tend to drop. The degree with which the first valve 84 is opened is typically a function of the difference in temperatures between that selected by the dial 80 and that measured by the thermistor 62 so that flow supplied to the pipe 70 is progressively variable depending on the difference in temperatures. The amount with which the first valve 84 is opened may, alternatively, be controlled by means of a PID function.

It can therefore be seen that the temperature of the semiconductor chip 14 can be maintained at a more consistent level which is selected by the dial 80.

Heat convects naturally from the heat sink 34. More heating and less cooling is therefore required. The heat sink 34 is typically heated for about 65% of the time and cooled for about 10% of the time. The heat sink 34 is at a required temperature for about 25% of the time.

Figure 2:
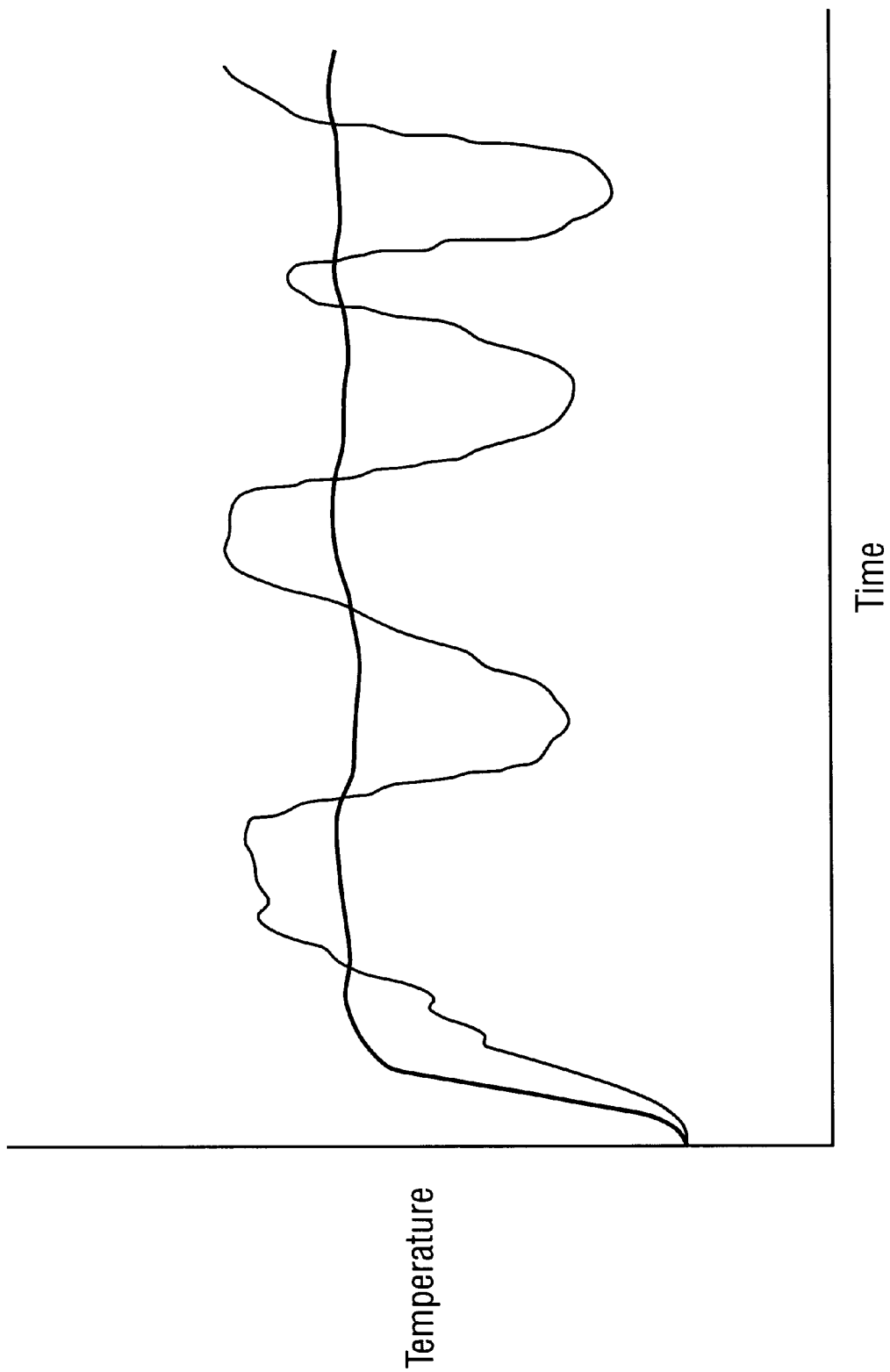
FIG. 2 is a graph of temperature against time of a heat sink, illustrating both the temperature of the heat sink when carrying out the invention and without carrying out the invention.

FIG. 2 of the accompanying drawings is a graph which shows the temperature measured by the thermistor 62 over time, respectively when the temperature of the heat sink 34 is not controlled by means of a controller such as the controller 18 of FIG. 1, and when utilizing the controller 18. When not using a controller, it can be seen that the temperature measured by the thermistor 62 oscillates with time depending on the demands of the particular operating system or program supplied by the computer. With the controller 18, a more uniform temperature results.

The temperature of the heat sink 34 may be changed in order to simulate certain scenarios. In FIG. 2, for example, the temperature of the heat sink 34 is maintained at a temperature which is above an average without a controller. By so increasing the average temperature of the heat sink a worst case temperature scenario can be simulated under which the integrated circuit 14 should be able to operate without failure.

Referring again to FIG. 1, the controller 18 may also include a system for cooling the heat sink 34 when the computer 54 is switched off. This allows an operator to remove the integrated circuit 14 from the holder 12. The central control unit 76 receives a signal from a switch 90 through which power is supplied to the computer 54. Once the computer 54 is switched off by means of the switch 90, the central control unit 76 shuts down power supplied to the heater 66. The central control unit 76 also opens a second valve 92 of the flow control unit 68 by supplying power in an on/off manner to a solenoid 94. The solonoid 94 then adjusts the second valve 92 from a closed to an open position. The second valve 92 is located in parallel with the first valve 84, and in line between the source of pressurized air 69 and the pipe 70. By opening the second valve 92 flow is supplied to the pipe 70 which directs the flow onto the heat sink 34, thereby cooling the heat sink 34. The heat sink 34 is cooled until it is safe for an operator to open the latch 28 and remove the cap 26 together with the substrate 20 and the semiconductor chip 14.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A test setup for testing an integrated circuit, comprising:
   a holder capable of releasably receiving and holding an integrated circuit;
   apparatus for testing the integrity of the integrated circuit;
   a heat sink located on the holder, the heat sink having a surface positioned to absorb heat buildup on the integrated circuit;
   a heater located within the heat sink;
   a flow control unit for blowing a fluid over the heat sink;
   a temperature detector positioned to measure a variable which is indicative of a temperature of the integrated circuit; and
   a controller which reacts to the variable to (i) alter power supplied to the heater so that the heater heats the heat sink and the heat sink heats the integrated circuit, or (ii) so that the flow control unit blows a fluid over the heat sink so that the heat sink is cooled, cooling of the heat sink causing cooling of the integrated circuit.

2. A test setup of claim 1 wherein the apparatus comprises:
   electrical contacts on the holder making contact with electrical leads extending from the integrated circuit;
   an electrical socket;
   electrical lines which connect the electrical contacts with the electrical socket.

3. The test setup of claim 2 which includes a card, wherein the holder and the electrical socket are mounted to the card.

4. The test setup of claim 2 which includes an electrical tester, wherein the electrical socket is connected to the electrical tester.

5. The test setup of claim 4 wherein the electrical tester is a computer.

6. The test setup of claim 2 wherein the heat sink is positioned so that the surface contacts the integrated circuit.

7. The test setup of claim 1 wherein flow of fluid supplied by the flow control unit is progressively variable.

8. The test setup of claim 7 wherein the flow of fluid supplied by the flow control unit is, in addition to being progressively variable, also affected in an on/off manner.

9. The test setup of claim 1 wherein the heat sink includes at least one fin and the flow control unit blows fluid over the fin.

10. The test setup of claim 1 further comprising:
    a pipe having a first end connected to the flow control unit and a second end positioned to blow fluid, received from the flow control unit, onto the heat sink, wherein the flow control unit reacts on the variable to alter flow of fluid supplied by the flow control unit to the pipe.

11. The test setup of claim wherein the 10 flow control unit operates in either
    a first mode wherein power is supplied to the heat sink, or
    a second mode wherein flow is supplied by the flow control unit to the pipe.

12. A method of testing an integrated circuit, the method:
    connecting the integrated circuit to an electrical tester;
    utilizing the electrical tester to test the integrity of the integrated circuit;
    measuring a variable which is indicative of the temperature of a chip; and
    reacting on the variable to alter a temperature of the chip by:
    (i) blowing a fluid onto a heat sink thereby transferring heat from the integrated circuit to the heat sink and connecting the heat from the heat sink or
    (ii) supplying power to a heater located within the heat sink to heat the heat sink which, in turn, heats the integrated circuit.

13. The method of claim 12 wherein the temperature of the integrated circuit is altered while the integrity of the chip is being tested.

14. A test setup for testing an integrated circuit, comprising:
    a holder capable of releasably receiving and holding an integrated circuit;
    apparatus for testing the integrity of the integrated circuit;
    a heat sink located on the holder, the heat sink having a surface positioned to absorb heat buildup on the integrated circuit, and a plurality of fins for connecting heat away therefrom;
    a heater located within the heat sink;
    a temperature detector positioned to measure a variable which is indicative of a temperature of the integrated circuit; and
    a controller which reacts to the variable to alter power supplied to the heater.

* * * * *

UNITED STATES PATENT AND TRADEMARK OFFICE
CERTIFICATE OF CORRECTION

PATENT NO. : 6,144,215
DATED : November 4, 2000
INVENTOR(S) : Maxwell et al.

It is certified that error appears in the above-identified patent and that said Letters Patent is hereby corrected as shown below:

<u>Column 6,</u>
Line 10, before "flow control", delete "10".
Line 10, after "claim", insert -- 10 --.

Signed and Sealed this

Eighth Day of October, 2002

Attest:

JAMES E. ROGAN
Attesting Officer
Director of the United States Patent and Trademark Office